(12) United States Patent
Bell et al.

(10) Patent No.: US 7,459,936 B2
(45) Date of Patent: Dec. 2, 2008

(54) FAST/SLOW STATE MACHINE LATCH

(75) Inventors: Richard R. Bell, Hinesburg, VT (US); Wilson D. Skipwith, Essex Junction, VT (US); Sebastian T. Ventrone, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/869,988

(22) Filed: Oct. 10, 2007

(65) Prior Publication Data
US 2008/0024166 A1 Jan. 31, 2008

Related U.S. Application Data

(62) Division of application No. 11/163,750, filed on Oct. 28, 2005, now Pat. No. 7,331,021.

(51) Int. Cl.
*G06F 7/38* (2006.01)
*H03K 19/173* (2006.01)

(52) U.S. Cl. .............................. 326/46; 326/52; 327/144

(58) Field of Classification Search .................. 326/46, 326/52; 327/141, 144
See application file for complete search history.

(56) References Cited

U.S. PATENT DOCUMENTS

| | | | |
|---|---|---|---|
| 4,535,459 A * | 8/1985 | Hogge, Jr. .................... 375/324 |
| 5,083,049 A * | 1/1992 | Kagey ......................... 327/141 |
| 5,327,019 A | 7/1994 | Kluck |
| 5,539,337 A | 7/1996 | Taylor et al. |
| 5,539,786 A * | 7/1996 | Snelgrove .................... 375/373 |
| 5,578,946 A | 11/1996 | Carberry et al. |
| 5,621,337 A * | 4/1997 | Childs ......................... 326/46 |
| 5,684,422 A | 11/1997 | Witt et al. |
| 5,731,715 A * | 3/1998 | Mote, Jr. ....................... 326/93 |
| 6,054,877 A | 4/2000 | Ventrone |
| 6,247,089 B1 | 6/2001 | Kuo et al. |
| 6,255,876 B1 | 7/2001 | Chen et al. |
| 6,320,442 B1 * | 11/2001 | Sindalovsky ................. 327/218 |
| 6,351,508 B1 * | 2/2002 | Shishkoff et al. ........... 375/375 |
| 6,415,402 B2 | 7/2002 | Bishop et al. |
| 6,456,109 B2 * | 9/2002 | Urushiyama ................. 326/38 |
| 6,763,505 B2 | 7/2004 | Baumgartner et al. |
| 6,943,581 B1 * | 9/2005 | Cruz et al. .................... 326/41 |
| 7,331,021 B2 * | 2/2008 | Bell et al. ...................... 716/2 |
| 2003/0154458 A1 | 8/2003 | Butts et al. |
| 2005/0251773 A1 | 11/2005 | Bair et al. |

* cited by examiner

*Primary Examiner*—Rexford Barnie
*Assistant Examiner*—Jason Crawford
(74) *Attorney, Agent, or Firm*—Michael LeStrange; Hoffman Warnick LLC

(57) ABSTRACT

A fast/slow state machine latch is provided that generates fast and slow select signals for a single toggle, low power multiplexer circuit. In accordance with an embodiment of the present invention, the fast/slow state machine latch includes a first latch with a delayed output, a second latch with an undelayed output, an inverter for coupling the delayed output of the first latch to an input of the second latch, and an exclusive-OR (XOR) gate coupled to the delayed output of the first latch and a data input, an output of the XOR gate coupled to an input of the first latch. A method for incorporating low power multiplexer circuits into a circuit design with minimal input from a circuit designer is also provided.

14 Claims, 6 Drawing Sheets

| User Select | Previous State FS, SS | Data Out Port | Next State FS | Next State SS | Data Out Port |
|---|---|---|---|---|---|
| 0 | 00 | on | 1 | 0 | off |
| 0 | 01 | off | 0 | 1 | off |
| 0 | 10 | off | 1 | 0 | off |
| 0 | 11 | on | 0 | 1 | off |
| 1 | 00 | on | 0 | 1 | on |
| 1 | 01 | off | 1 | 0 | on |
| 1 | 10 | off | 0 | 1 | on |
| 1 | 11 | on | 1 | 0 | on |

FIG. 4

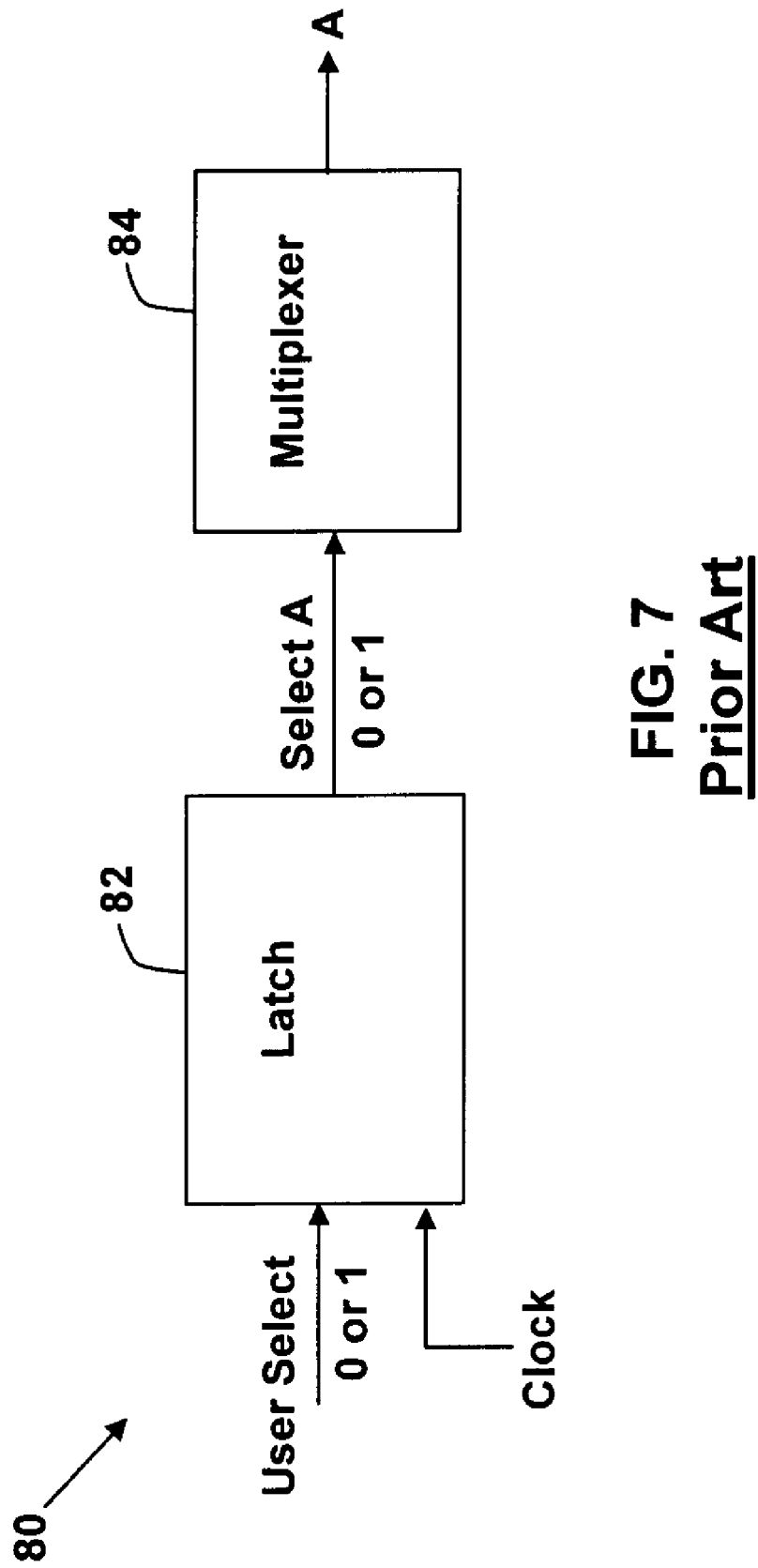

FAST/SLOW STATE MACHINE LATCH

CROSS-REFERENCE TO RELATED APPLICATIONS

This application is a Divisional application of co-pending patent application Ser. No. 11/163,750, filed Oct. 28, 2005, which is hereby incorporated by reference.

BACKGROUND OF THE INVENTION

1. Field of the Invention

The present invention generally relates to integrated circuits. More particularly, the present invention provides a fast/slow state machine latch that generates fast and slow select signals for a single toggle, low power multiplexer circuit.

2. Related Art

Many conventional multiplexers suffer from excessive power consumption due to invalid data signal transitions (e.g., glitches). To this extent, a low power multiplexer circuit has been developed that undergoes data signal transitions only for valid data signals, thus reducing power consumption. Such a low power multiplexer circuit is disclosed in U.S. Pat. No. 6,054,877, which is incorporated in its entirety herein by reference. Unfortunately, extensive education is required to understand the operation/implementation of this type of low power multiplexer circuit, thereby hindering its use and acceptance by circuit designers.

SUMMARY OF THE INVENTION

The present invention provides a fast/slow state machine latch that generates fast and slow select signals for a single toggle, low power multiplexer circuit. The present invention also provides a methodology whereby a circuit designer can design a circuit using conventional latch/multiplexer logic, and then swap out selected conventional latch/multiplexer logic in the circuit design with low power multiplexer circuits and fast/slow state machine latches of the present invention, in order to reduce the power consumption of the circuit design.

A first aspect of the present invention is directed to a state machine latch having a dual output to drive a select line of a multiplexer in an integrated circuit, comprising a first latch with a delayed output, a second latch with an undelayed output, an inverter for coupling the delayed output of the first latch to an input of the second latch, and an exclusive-OR (XOR) gate coupled to the delayed output of the first latch and a data input, an output of the XOR gate coupled to an input of the first latch.

A second aspect of the present invention is directed to an integrated circuit, comprising a low power multiplexer circuit, and a state machine latch for driving a select line of the low power multiplexer circuit, the state machine latch comprising a first latch with a delayed output, a second latch with an undelayed output, an inverter for coupling the delayed output of the first latch to an input of the second latch, and an exclusive-OR (XOR) gate coupled to the delayed output of the first latch and a data input, an output of the XOR gate coupled to an input of the first latch.

A third aspect of the present invention is directed to a circuit design method, comprising selecting a candidate multiplexer circuit in a circuit design for replacement, wherein the candidate multiplexer circuit comprises a latch and multiplexer, swapping the multiplexer of the candidate multiplexer circuit with a single toggle, low power multiplexer circuit, swapping the latch of the candidate multiplexer with a fast/slow state machine latch, wherein the fast/slow state machine latch provides a pair of select signals for driving a select line of the single toggle, low power multiplexer circuit, and performing a timing check to ensure proper timing of the select signals.

BRIEF DESCRIPTION OF THE DRAWINGS

These and other features of this invention will be more readily understood from the following detailed description of the various aspects of the invention taken in conjunction with the accompanying drawings in which:

FIG. 4 depicts a truth table for a fast/slow state machine latch in accordance with an embodiment of the present invention.

FIG. 7 depicts a conventional latch/multiplexer circuit.

Figure 1:
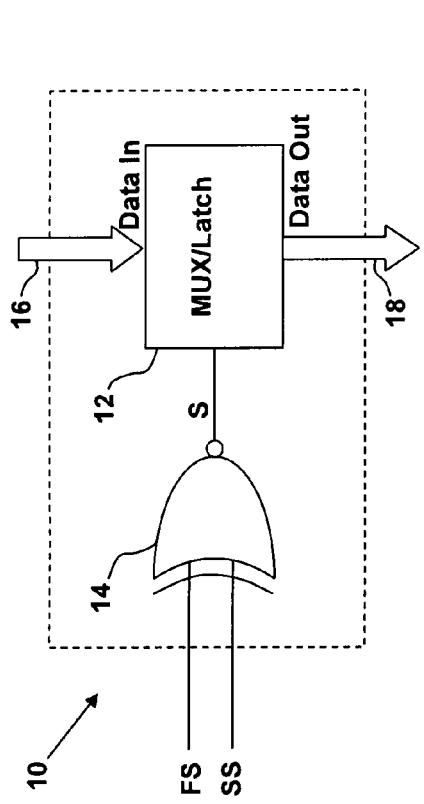
FIG. 1 depicts an illustrative circuit diagram of a single toggle, low power multiplexer circuit.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

The present invention provides a fast/slow state machine latch that generates fast and slow select signals for a single toggle, low power multiplexer circuit. The present invention also provides a methodology whereby a circuit designer can design a circuit using conventional latch/multiplexer logic, and then swap out selected conventional latch/multiplexer logic in the circuit design with low power multiplexer circuits and fast/slow state machine latches of the present invention, in order to reduce the power consumption of the circuit design.

An illustrative circuit diagram of a single toggle, low power multiplexer circuit 10 is depicted in FIG. 1. The multiplexer circuit 10 generally includes a MUX/latch circuit 12 and an XNOR circuit 14. The MUX/latch circuit 12 includes a data-in port 16 and a data-out port 18. A fast select (FS) signal and a slow select (SS) signal are input to the XNOR circuit 14. The XNOR circuit 14 produces a select signal S only upon the occurrence of "1,1" state input signals or "0,0" state input signals; that is, the fast select FS and slow select SS signals must both be in the "1" or the "0" state to produce a select signal S from XNOR 14. The MUX/latch circuit 12 is controlled by the select signal S from the XNOR circuit 14. The multiplexer circuit 10 will typically include one or more additional data-in ports each associated with a respective XNOR gate, fast select FS signal, slow select SS signal, and select signal S. However, for clarity, only one data-in port is depicted in FIG. 1.

The multiplexer circuit 10 circuit of FIG. 1 operates in accordance with specific rules, which are:

1. No new data is processed until select off occurs. The previous select must go away at or before new select and before the previous data changes.

2. No new select occurs before new data is received.

3. If there is a no select, data must be held either with a soft latch or a dedicated select for holding previous data.

4. If a same select occurs, a deselect takes place during data transmission; that is, the select must go inactive during data transition time.

Following these rules, for any cycle, the output of the MUX/latch circuit 12 of FIG. 1 will transition one time only (for valid data only). The function is carried out by using two selects for the data-in port 16. One select is the fast select FS signal, and the second select is the slow select SS signal. The fast select FS signal is timed to be faster than the occurrence of the fastest data at the data-in port 16. The slow select SS signal is timed to arrive after the occurrence of the slowest data at the data-in port 16 (i.e., the slow select SS signal must be slower than the slowest data).

As shown in FIG. 1, the fast select FS signal and slow select SS signal are fed into the XNOR circuit 14. The fast select FS signal and slow select SS signal must be the same value (either both "0" or both "1") to provide a select signal S to gate the data bits at the data-in port 16 of the MUX/latch circuit 12 to the data-out port 18 as data output signals. Between the data-in port 16 and data-out port 18, the MUX/latch circuit 12 contains a soft latch circuit (not shown) to hold the output stage either during a selection to a new (or the same) data port, or if no pair of fast and slow selects are active. If the data-out port 18 is to be selected from one cycle to another, then the fast select FS signal and slow select SS signal are toggled (if both "0", then on the next cycle both would be "1" and vice versa). By toggling the fast select FS signal and slow select SS signal, the data-in port 16 is deselected during the input data transition. The fast select FS signal will go to the new state before the slow select SS signal, temporally disconnecting the data-in port 16 from the data-out port 18 during the transition at the data-in port 16. Once the slow select SS signal changes to the same value as the fast select FS signal, the data transition is complete, the MUX/latch circuit 12 is gated, and the new value at the data-in port 16 is allowed to pass to the output stage.

Figure 2:
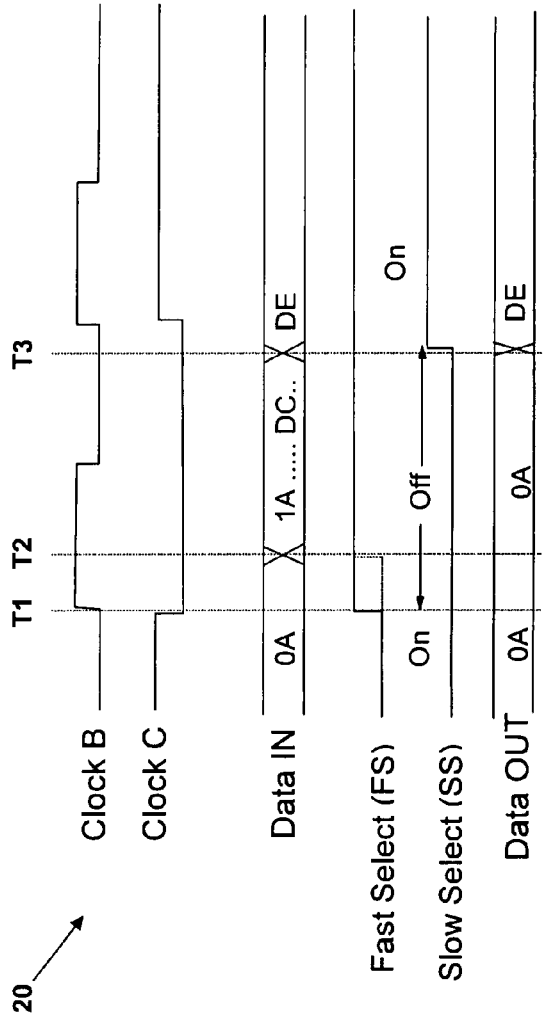
FIG. 2 depicts an illustrative timing diagram for the multiplexer circuit of FIG. 1 during the reselection of the data-in port for new input data.

An illustrative timing diagram 20 for the multiplexer circuit 10 of FIG. 1 during the reselection of the data-in port 16 for new input data is depicted in FIG. 2. Initially, the fast select FS signal and slow select SS signal are both in the "0" state and the data ("0A") at the data-in port 16 is present at the data-out port 18. At time T1, prior to the arrival of new input data ("DE") at the data-in port 16, the fast select FS signal is toggled to the "1" state, thereby disconnecting the data-in port 16 from the data-out port 18. The data "0A" at the data-out port 18 is held by the soft latch of the MUX/latch circuit 12. At time T2, the data at the data-in port 16 starts transitioning from the value "0A" to the value "DE." Since the data-in port 16 is disconnected from the data-out port 18, glitches due to intermediate data transitions (i.e., invalid data) are not propagated to the data-out port 18. At time T3, after the new data "DE" is available at the data-in port 16, the slow select SS signal is toggled to the "1" state, thereby reconnecting the data-in port 16 to the data-out port 18. The new data "DE" is now available at the data-out port 18.

Figure 3:
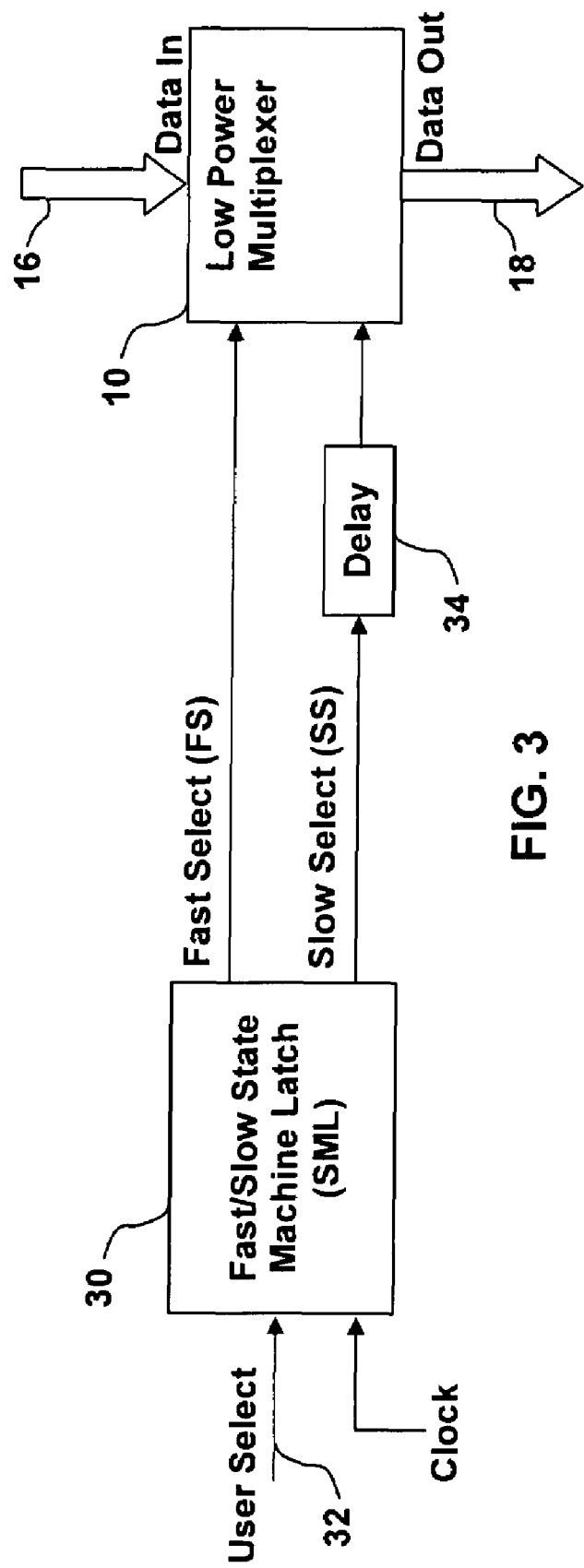
FIG. 3 depicts a fast/slow state machine latch for use with a single toggle, low power multiplexer circuit in accordance with an embodiment of the present invention.

As shown in FIG. 3, the present invention provides a fast/slow state machine latch (SML) 30 for use with a single toggle, low power multiplexer circuit 10. In response to a user select signal 32, the fast/slow SML 30 generates a fast select FS signal and a slow select SS signal for controlling the operation of the multiplexer circuit 10. A delay circuit 34 comprising one or more delay blocks is provided to ensure the proper timing of the slow select SS signal.

A truth table 40 for the fast/slow SML 30 of FIG. 3 in accordance with an embodiment of the present invention is depicted in FIG. 4. Column 42 of the truth table 40 lists the user select signal 32 applied to the fast/slow SML 30, where a "0" indicates that the data-out port 18 of the multiplexer circuit 10 is to be turned "off," while a "1" indicates that the data-out port 18 is to be turned "on." Column 44 lists the previous states of the fast select FS and slow select SS signals output by the fast/slow SML 30. Column 46 lists the current state (i.e., "on" or "off") of the data-out port 18. Column 48 lists the next state of the fast select FS signal. Column 50 lists the next state of the slow select SS signal. The last column 52 lists the next state (i.e., "on" or "off") of the data-out port 18 of the multiplexer circuit 10. For example, referring to row 54 of the truth table 40, in order to turn the data-out port 18 of the multiplexer circuit 10 "off," and given that the data-out port 18 is currently "on" and the previous states of the fast select FS and slow select SS signals were "0" and "0," respectively, the next states of the fast select FS and slow select SS signals should be "1" and "0," respectively. As another example, referring to row 56 of the truth table 40, in order to keep the data-out port 18 of the multiplexer circuit 10 "on" from one cycle to another, and given that the previous states of the fast select FS and slow select SS signals were "0" and "0," respectively, the next states of the fast select FS and slow select SS signals should be "1" and "1," respectively.

Figure 5:
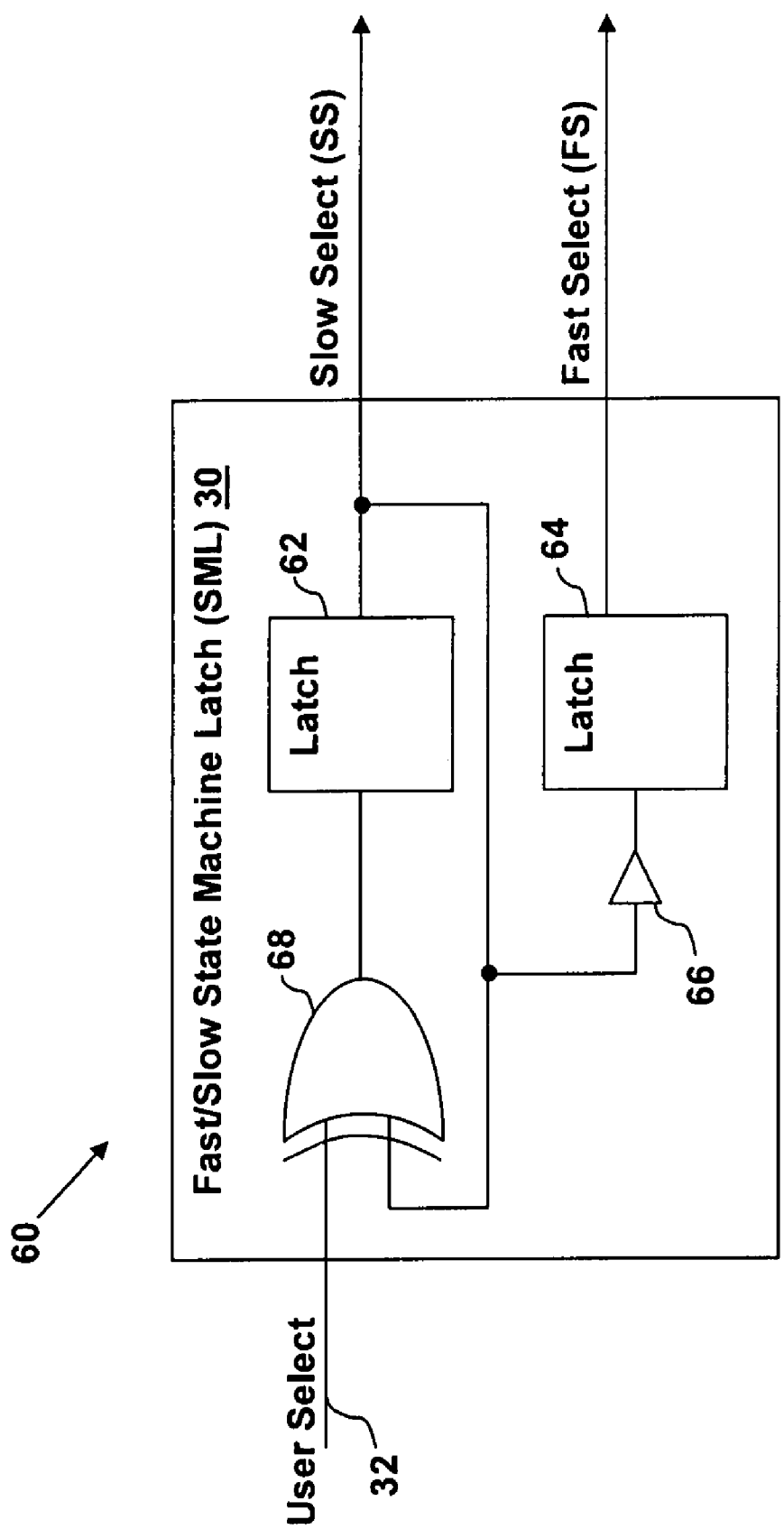
FIG. 5 depicts a logic implementation of a fast/slow state machine latch in accordance with an embodiment of the present invention.

A logic implementation 60 of the fast/slow SML 30 in accordance with an embodiment of the present invention is depicted in FIG. 5. The fast/slow SML 30 includes a latch 62 for providing a delayed signal (i.e., slow select SS signal) and a latch 64 for providing an undelayed signal (i.e., fast select FS signal). The slow select SS signal provided by the latch 62 is coupled to an input of the latch 64 through an inverter 66. As such, the fast select FS signal output by the latch 64 comprises the inverse of the previous slow select SS signal provided by the latch 62. That is:

Next Fast Select FS=$\overline{\text{PreviousSlowSelectSS}}$

The slow select SS signal and the user select signal 32 are input to an exclusive-OR (XOR) circuit 68. The output of the XOR circuit is input into the latch 62. As such:

Next Slow Select SS=User Select XOR Previous Slow Select SS

The above logical expressions can be verified by examining the corresponding entries of the truth table 40 illustrated in FIG. 4.

Figure 6:
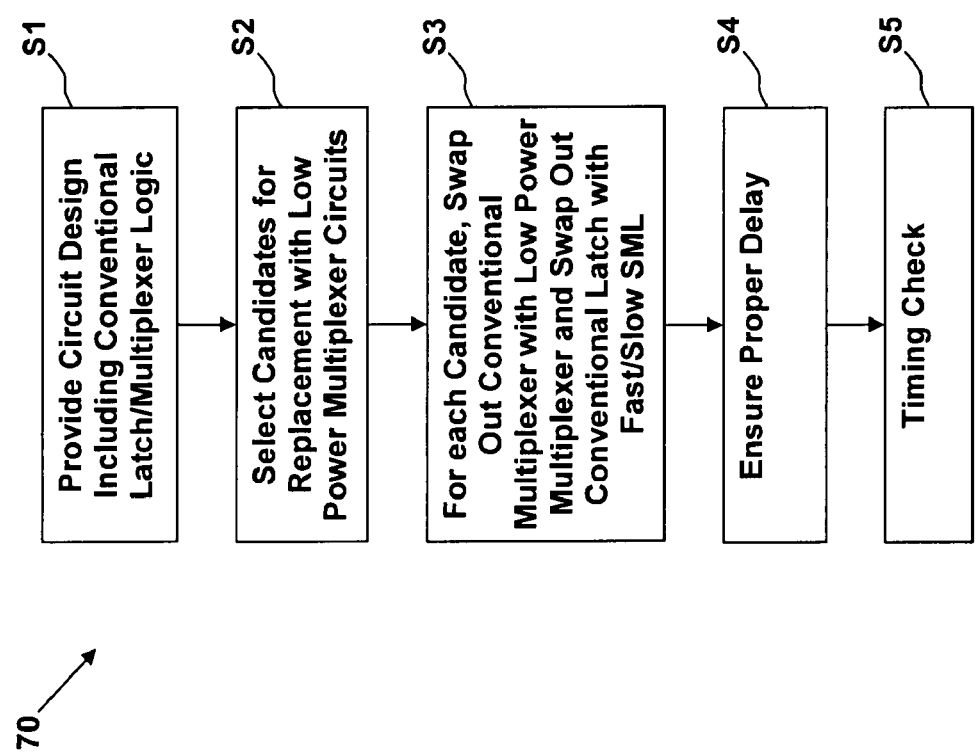
FIG. 6 depicts a flow diagram of a method in accordance with an embodiment of the present invention.

As discussed above, extensive education is required to understand the operation/implementation of a single toggle, low power multiplexer circuit, thereby hindering its use and acceptance by circuit designers. Advantageously, the present invention provides a method for incorporating low power multiplexer circuits into a circuit design with minimal input from, or completely transparent to, the circuit designer. A flow diagram 70 of the method is depicted in FIG. 6.

In step S1, a circuit design incorporating conventional latch/multiplexer logic is provided by a circuit designer. An illustrative conventional latch/multiplexer circuit 80 including a latch 82 coupled to a multiplexer 84 is depicted in FIG. 7. In step S2, (higher power) candidates for replacement with single toggle, low power multiplexer circuits are selected based on the results of existing power analysis tools. Steps S1 and S2 can be performed sequentially, in reverse order, or in parallel. In step S3, for each candidate selected in step S2, swap out the multiplexer (e.g., multiplexer 84) with a single toggle, low power multiplexer circuit (e.g., single toggle, low power multiplexer circuit 10, FIG. 1) and swap out the latch (e.g., latch 82) with a fast/slow SML of the present invention (e.g., fast/slow SML 60, FIG. 5). In step S4, provide sufficient delay (e.g., by providing delay blocks) to ensure proper timing of the slow select SS signal for each fast/slow SML latch. In step S5, perform a timing check to ensure that timing of the fast/slow SML latch is correct for proper operation of the single toggle, low power multiplexer circuit.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A state machine latch having a dual output to drive a select line of a multiplexer in an integrated circuit, comprising:
   a first latch with a delayed output;
   a second latch with an undelayed output;
   an inverter for coupling the delayed output of the first latch to an input of the second latch; and
   an exclusive-OR (XOR) gate coupled to the delayed output of the first latch and a data input, an output of the XOR gate coupled to an input of the first latch.

2. The state machine latch of claim 1, wherein the delayed output comprises a slow select signal and wherein the undelayed output comprises a fast select signal.

3. The state machine latch of claim 2, wherein the fast select signal comprises an inverse of a previous slow select signal provided by the first latch.

4. The state machine latch of claim 2, wherein the slow select signal comprises an exclusive-OR of the data input and a previous slow select signal provided by the first latch.

5. The state machine latch of claim 2, wherein the multiplexer comprises a single toggle, low power multiplexer.

6. The state machine latch of claim 5, wherein the fast select signal is timed to arrive at the select line of the multiplexer before a fastest data arrives at a data-in port of the multiplexer, and wherein the slow select signal is timed to arrive at the select line of the multiplexer after a slowest data arrives at the data-in port of the multiplexer.

7. The state machine latch of claim 6, further comprising:
   a delay circuit coupled between the delayed output of the first latch and the select line of the multiplexer to ensure a proper timing of the slow select signal.

8. An integrated circuit, comprising:
   a low power multiplexer circuit; and
   a state machine latch for driving a select line of the low power multiplexer circuit, the state machine latch comprising:
   a first latch with a delayed output;
   a second latch with an undelayed output;
   an inverter for coupling the delayed output of the first latch to an input of the second latch; and
   an exclusive-OR (XOR) gate coupled to the delayed output of the first latch and a data input, an output of the XOR gate coupled to an input of the first latch.

9. The integrated circuit of claim 8, wherein the delayed output comprises a slow select signal and wherein the undelayed output comprises a fast select signal.

10. The integrated circuit of claim 9, wherein the fast select signal comprises an inverse of a previous slow select signal provided by the first latch.

11. The integrated circuit of claim 9, wherein the slow select signal comprises an exclusive-OR of the data input and a previous slow select signal provided by the first latch.

12. The integrated circuit of claim 9, wherein the low power multiplexer circuit comprises a single toggle, low power multiplexer circuit.

13. The integrated circuit of claim 12, wherein the fast select signal is timed to arrive at the select line of the multiplexer before a fastest data arrives at a data-in port of the multiplexer, and wherein the slow select signal is timed to arrive at the select line of the multiplexer after a slowest data arrives at the data-in port of the multiplexer.

14. The integrated circuit of claim 13, further comprising:
   a delay circuit coupled between the delayed output of the first latch and the select line of the multiplexer to ensure a proper timing of the slow select signal.

* * * * *